United States Patent
Xia et al.

(10) Patent No.: US 9,276,605 B2
(45) Date of Patent: Mar. 1, 2016

(54) COMPRESSION AND DE-COMPRESSION OF COMPLEX VALUED OFDM DATA FOR A RADIO BASE STATION

(71) Applicant: Telefonaktiebolaget L M Ericsson (publ), Stockholm (SE)

(72) Inventors: Bin Xia, Sichuan (CN); Min Wei, Sichuan (CN)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/760,516

(22) PCT Filed: Jan. 16, 2013

(86) PCT No.: PCT/CN2013/070536
§ 371 (c)(1),
(2) Date: Jul. 13, 2015

(87) PCT Pub. No.: WO2014/110730
PCT Pub. Date: Jul. 24, 2014

(65) Prior Publication Data
US 2015/0358030 A1    Dec. 10, 2015

(51) Int. Cl.
*H03M 7/30* (2006.01)
*H03M 7/00* (2006.01)
(Continued)

(52) U.S. Cl.
CPC . *H03M 7/00* (2013.01); *H04K 1/02* (2013.01); *H04L 25/03* (2013.01); *H04L 27/2601* (2013.01)

(58) Field of Classification Search
CPC ..... H03M 7/00; H04L 27/2601; H04L 25/03; H04L 27/2605; H04K 1/02

USPC .............................................. 341/87, 67, 107
See application file for complete search history.

(56) References Cited

U.S. PATENT DOCUMENTS 7,778,318 B1 * 8/2010 Olney ................. H04L 27/2647
375/224
8,699,449 B2 * 4/2014 Dinan ....................... H04L 1/00
370/330

(Continued)

FOREIGN PATENT DOCUMENTS

| CN | 102510368 A | 6/2012 |
| WO | 2007115121 A2 | 10/2007 |
| WO | 2009151893 A2 | 12/2009 |

OTHER PUBLICATIONS

3GPP, "3rd Generation Partnership Project; Technical Specification Group Radio Access Network; Evolved Universal Terrestrial Radio Access (E-UTRA); Base Station (BS) conformance testing (Release 10)", 3GPP TS 36.141 V10.3.0, Jun. 2011, 1-170.

(Continued)

*Primary Examiner* — Brian Young
(74) *Attorney, Agent, or Firm* — Murphy, Bilak & Homiller, PLLC

(57) ABSTRACT

A compression method is disclosed, which comprises receiving an OFDM data block comprising a plurality of complex valued data samples wherein each in-phase and quadrature sample value is represented by a first number of bits. The method also comprises calculating an average of absolute sample values of the OFDM data block and mapping the average absolute sample value to a standard deviation value. The method further comprises quantizing each of the sample values using quantization thresholds scaled by the standard deviation value to produce quantized in phase and quadrature sample value representations, each comprising a second number of bits, and mapping the standard deviation value and the quantized sample value representations to an OFDM transmission frame. Corresponding de-compression method, compressor, de-compressor and network node are also disclosed.

17 Claims, 7 Drawing Sheets

(51) Int. Cl.
    *H04L 27/26* (2006.01)
    *H04K 1/02* (2006.01)
    *H04L 25/03* (2006.01)

(56) References Cited

U.S. PATENT DOCUMENTS

| | | | |
|---|---|---|---|
| 8,774,294 B2* | 7/2014 | Shental | H04L 25/0202 375/260 |
| 9,106,324 B1* | 8/2015 | Mahmoud | H04B 15/00 |
| 2007/0081601 A1 | 4/2007 | McCoy | |

OTHER PUBLICATIONS

Bahai, Ahmad et al., "A New Approach for Evaluating Clipping Distortion in Multicarrier Systems", IEEE Journal on Selected Areas in Communications, vol. 20, No. 5, May 2002, 3-11.

Benz, Ursula et al., "A Comparison of Several Algorithms for SAR Raw Data Compression", IEEE Transactions on Geoscience and Remote Sensing, vol. 33, No. 5, Sep. 1995, 1266-1276.

Christensen, E. L., "Block Floating Point for Radar Data", IEEE Transactions on Aerospace and Electronic Systems, vol. 35, No. 1, Jan. 1999, 308-318.

Kwok, Ronald et al., "Block Adaptive Quantization of Magellan SAR Data", IEEE Transactions on Geoscience and Remote Sensing, vol. 27, No. 4, Jul. 1989, 375-383.

Linde, Yoseph et al., "An Algorithm for Vector Quantizer Design", IEEE Transactions on Communications, vol. COM-28, No. 1, Jan. 1980, 84-95.

Lloyd, Stuart P., "Least Squares Quantization in PCM", IEEE Transactions on Information Theory, vol. IT-28, No. 2, Mar. 1982, 129-137.

Unknown, "Common Public Radio Interface (CPRI); Interface Specification", CPRI Specification V4.2, Sep. 29, 2010, 1-113.

* cited by examiner

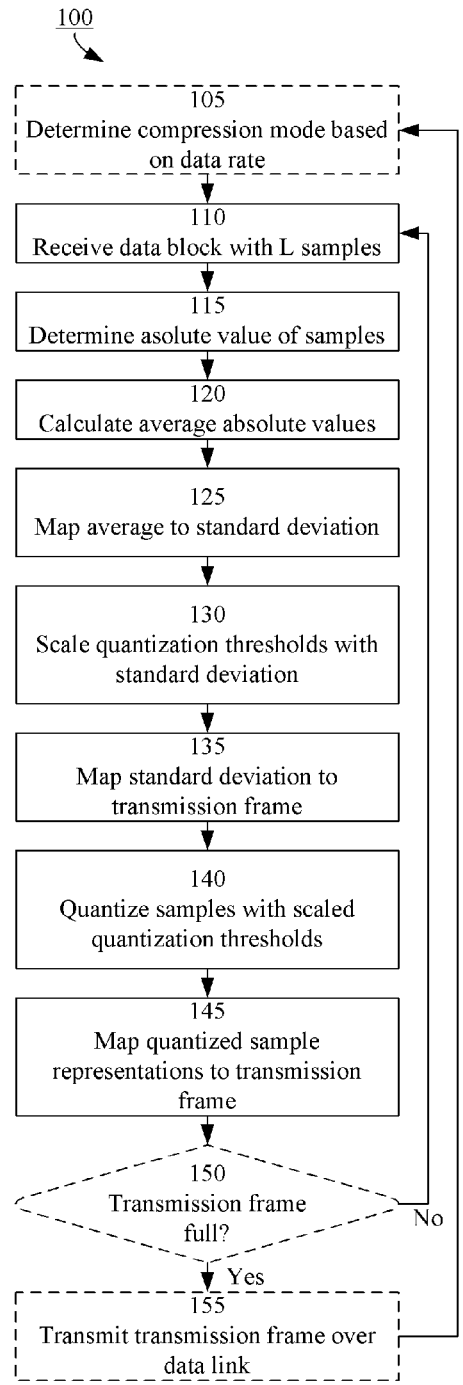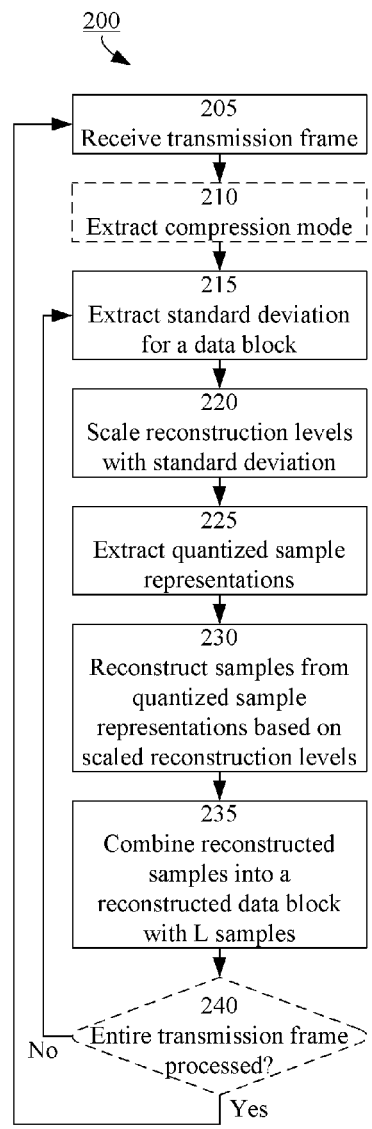
Fig. 1
Fig. 2

COMPRESSION AND DE-COMPRESSION OF COMPLEX VALUED OFDM DATA FOR A RADIO BASE STATION

TECHNICAL FIELD

The present invention relates generally to the field of compression and de-compression of data. More particularly, it relates to compression and de-compression of complex valued orthogonal frequency division multiplex (OFDM) data for a radio base station.

BACKGROUND

In a typical radio base station (RBS), a digitized and serial internal interface may establish a connection between radio equipment control (REC) and radio equipment (RE) of the RBS. Such an interface is specified in the specification for common public radio interface (CPRI), available from http://www.cpri.info/spec.html. For an RBS system supporting the universal mobile telecommunication standard, long term evolution/long term evolution advanced (UMTS LTE/LTE-A), a complex valued time domain OFDM signal is typically transported between remote radio unit (RRU) and baseband unit (BBU) of the RBS via the CPRI. The in-phase (I) and quadrature (Q) modulated data (i.e. digital baseband signals with I and Q components per complex valued sample) may be denoted I/Q data in user plane information of the CPRI.

As requirements on the maximum data rate between RRU and BBU of the RBS (and the data rate of backhauling between eNBs) increase (e.g. in OFDM due to increased radio frequency (RF) bandwidth, increased number of carriers per sector, multiple antenna technology (e.g. multiple input multiple output—MIMO), coordinated multi point (CoMP), cascading and multihop topologies of the RRU, etc.), increasingly higher requirements are posed on the CPRI implementation (e.g. number of CPRI ports, speed and cost of fiber module, and operating speed of serializer/deserializer units (SerDes)) for accelerating the CPRI line bit rate.

A typical CPRI implementation comprises transceiver modules, which are hardware units at both ends (RRU and BBU) of an optical link. As indicated above, the increasing BBU-RRU connectivity requirements pose challenges to speed and capacity of the optical transceiver modules. To meet these increasing requirements for aggregated data rate of the internal RBS interface, the CPRI line bit rate may be increased and/or the number of CPRI ports allocated for RRU and BBU connection may be increased. Another possibility is to compress the data to be transferred over the CPRI, for example by using fewer bits to represent each sample.

Therefore, there is a need for methods and arrangements that reduces the amount of data, in particular complex valued OFDM data, for transfer over the CPRI. Various techniques may reduce the burden on the CPRI interface, including time domain schemes (e.g. reducing sample rate, reducing sample bit length via truncation) and transformed domain schemes (e.g. sub-carrier compression in the frequency domain).

Data rate may be a limiting factor also in other technology areas including data transfer, such as, for example, satellite communication and remote sensing. In relation to such technology areas, some compression algorithms for I/Q baseband data and implementations thereof are known and can generally be divided into three types (scalar compression, vector compression and transformed domain compression). Examples of scalar compression may be found in "Block floating point for radar data" by E. Christensen, IEEE transactions on Aerospace and Electronic Systems, vol. 35, no. 1, January 1999, pp. 308-318 and in "Block Adaptive Quantization of Magellan SAR Data" by R. Kwok, W. Johnson, IEEE transactions on Geoscience and Remote Sensing, vol. 27, no. 4, July 1989, pp. 375-383.

Signal-to-quantization-and-saturation-noise ratio for both fixed point and floating point uniform quantization representation are analytically expressed in "Block floating point for radar data" by E. Christensen, IEEE transactions on Aerospace and Electronic Systems, vol. 35, no. 1, January 1999, pp. 308-318.

Block floating point quantization (BFPQ) may be considered as a special case of floating point representation or as a tradeoff between fixed point and floating point representation.

In a typical quantization approach, a block of L consecutive samples is assigned a shared scaling factor corresponding to the largest magnitude among the samples in the block, i.e.

$$[x_0, \ldots, x_{L-1}] = [m_0, \ldots, m_{L-1}]2^{EXP}; m_l = x_l 2^{-EXP},$$

$$EXP = 1 + S + \log_2 \lfloor \max_{l=0, \ldots, L-1} |x_l| \rfloor,$$

where the range of each mantissa of the block is in the interval $|m_l| \in [0; 2^{-S}]$ for $l=0, 1, \ldots, L-1$, the integer S is a scaling factor used to prevent overflow, and $\lfloor . \rfloor$ denotes the floor operation that rounds a scalar value down to its closest integer.

In BFPQ, each block of samples is separately quantized to block-floating-point representation, and the shared block exponent EXP is represented only once for all samples within each block. If the magnitudes of mantissas $|m_l|$ are represented with $b_m$ bits and the block exponent EXP is represented with $b_{EXP}$ bits, each scaled sample is represented with $(1+b_m)+b_{EXP}/L$ bits on the average.

Due to signal power fluctuation, $b_m$ and $b_{EXP}$ may be different for each block. Hence, the average bit length per sample may vary from block to block, thus introducing fluctuation in the instantaneous resulting data rate, which in turn may cause difficulties in timing and frame synchronization. There may also be data rate fluctuation between the antenna paths in multi antenna applications, which may lead to adverse impact on time alignment between the antennas.

Many known techniques for reducing CPRI requirements suffer from one or more drawbacks such as, for example, high complexity, signaling overhead, real-time implementation difficulties, latency problems, information distortion, dynamic range limitations, and difficulties to control transfer data rate.

Therefore, there is a need for alternative solutions that reduces the amount of data, in particular complex valued OFDM data, for transfer over the CPRI. More particularly, there is a need for methods and arrangements that compress/de-compress complex valued OFDM data.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of some embodiments to obviate at least some of the above disadvantages and to provide methods and arrangements for compression/de-compression of complex valued OFDM data. Some embodiments provide compression/de-compression of the bit length (e.g. the resolution) of the in-phase sample value representation and the quadrature sample value representation of a complex valued sample.

According to a first aspect, this is achieved by a compression method comprising receiving a time domain complex valued Orthogonal Frequency Division Multiplex (OFDM) data block comprising a plurality of complex valued data samples wherein each complex valued data sample comprises an in-phase sample value and a quadrature sample value, each represented by a first number, M, of bits.

The method comprises determining an absolute sample value of each of the in-phase sample value and the quadrature sample value for each of the complex valued data samples, calculating an average of the absolute sample values of the time domain complex valued OFDM data block to produce an average absolute sample value, and mapping the average absolute sample value to a standard deviation value associated with the absolute sample values based on a mapping function.

The mapping function expresses the average absolute sample value as a first function minus a second function, wherein the first function is a function of the first number of bits and the second function is a sum of $2^{(M-1)}-1$ terms, each term comprising a function of the standard deviation.

The method also comprises (for each of the complex valued data samples) quantizing each of the in-phase sample value and the quadrature sample value using a number of quantization thresholds scaled by the standard deviation value to produce quantized in-phase and quadrature sample value representations, each comprising a second number of bits, wherein the second number of bits are fewer than the first number of bits.

The standard deviation value and the quantized in-phase and quadrature sample value representations are mapped to an OFDM transmission frame according to the method.

The OFDM transmission frame may, for example, be a CPRI basic frame or a backhaul communication transmission frame.

The standard deviation value may be associated with the absolute sample value by application of the central limit theorem to the in-phase and quadrature sample values. Thus, as a number of in-phase and quadrature sample values increases, their distribution approaches a Gaussian distribution with mean zero and a standard deviation corresponding to the standard deviation value.

The mapping from average absolute sample value to standard deviation value may comprise using the average absolute sample value to address a look-up table implementing the mapping function.

Alternatively, the mapping from average absolute sample value to standard deviation value may comprise calculating the standard deviation value based on the average absolute sample value and the mapping function.

The quantization thresholds may be levels of a non-uniform quantization. The quantization thresholds may, according to some embodiments, be based on a minimum mean square error between the in-phase and quadrature sample values and the quantized in-phase and quadrature sample value representations, wherein the in-phase and quadrature sample values have a Gaussian distribution with the standard deviation value and a mean value of zero. The quantization thresholds may, for example, comprise Lloyd-Max quantization thresholds.

According to some embodiments, a plurality of time domain complex valued OFDM data blocks may be processed according to the method, wherein the respective quantized in-phase and quadrature sample value representations are mapped to a same OFDM transmission frame.

In such embodiments, each of the plurality of data blocks may be associated with a respective standard deviation value, wherein the respective standard deviation values are mapped to the same OFDM transmission frame.

Alternatively, the plurality of data blocks may be associated with a same standard deviation value which is mapped to the OFDM transmission frame. In these embodiments, the method comprises calculating the average of the absolute sample values of the time domain complex valued OFDM data block over the plurality of data blocks to produce an average absolute sample value.

In some embodiments, the method also comprises transferring the OFDM transmission frame over a transfer medium. The transfer medium may, for example, comprise a common public radio interface (CPRI).

The mapping function may, for example, be $$\overline{|x|} = (2^{(M-1)} - 0.5) - \sum_{m=0}^{(2^{(M-1)}-2)} \mathrm{erf}\left(\frac{m+1}{\sigma\sqrt{2}}\right),$$

wherein $\sigma$ denotes the standard deviation value and $\overline{|x|}$ denotes the average absolute sample value. The function erf (.) is the error function and is defined as $$\mathrm{erf}(z) = \frac{2}{\sqrt{\pi}} \int_0^z e^{-t^2} dt.$$

In some embodiments, the time domain complex valued OFDM data block may be comprised in a first data stream having a variable first data rate and the OFDM transmission frame may be comprised in a second data stream having a fixed second data rate. In such embodiments, the method may further comprise selecting the number of quantization thresholds based on the first and second data rates. Thus, the quantization may be adapted (in terms of number of quantization thresholds, and possibly also in terms of quantization threshold distribution) to keep the transfer data rate (second data rate) constant regardless of the input data rate (first data rate).

A second aspect is a de-compression method comprising receiving an OFDM transmission frame comprising a standard deviation value and a plurality of quantized in-phase and quadrature sample value representations each comprising a second number of bits, extracting the standard deviation value, and extracting the quantized sample value representations.

The method also comprises (for each of the quantized in-phase and quadrature sample value representations) mapping the quantized in-phase or quadrature sample value representation to a reconstruction level scaled by the standard deviation value to produce a reconstructed in-phase or quadrature sample value represented by a third number of bits, wherein the second number of bits are fewer than the third number of bits, and combining the plurality of reconstructed in-phase and quadrature sample values to a reconstructed time domain complex valued OFDM data block.

In some embodiments, the received OFDM transmission frame may be the OFDM transmission frame according to the first aspect. The third number of bits may or may not be equal to the first number of bits according to these embodiments.

The method may further comprise scaling a number of reconstruction levels by the standard deviation value. The reconstruction levels may correspond to the quantization thresholds of the first aspect. For example, a reconstruction level may represent a reconstructed sample value between two adjacent quantization thresholds of the first aspect.

A third aspect is a compressor comprising an input port, an absolute value determiner, an average calculator, a statistics mapper, a quantizer and a signal mapper.

The input port is adapted to receive a time domain complex valued OFDM data block comprising a plurality of complex valued data samples wherein each complex valued data sample comprises an in-phase sample value and a quadrature sample value, each represented by a first number, M, of bits.

The absolute value determiner is adapted to determine an absolute sample value of each of the in-phase sample value and the quadrature sample value for each of the complex valued data samples, and the average calculator is adapted to calculate an average of the absolute sample values of the time domain complex valued OFDM data block to produce an average absolute sample value.

The statistics mapper is adapted to map the average absolute sample value to a standard deviation value associated with the absolute sample values based on a mapping function. The mapping function expresses the average absolute sample value as a first function minus a second function, wherein the first function is a function of the first number of bits and the second function is a sum of $2^{(M-1)}-1$ terms, each term comprising a function of the standard deviation value.

The quantizer is adapted to (for each of the complex valued data samples) quantize each of the in-phase sample value and the quadrature sample value using a number of quantization thresholds scaled by the standard deviation value to produce quantized in-phase and quadrature sample value representations, each comprising a second number of bits, wherein the second number of bits are fewer than the first number of bits, and the signal mapper is adapted to map the standard deviation value and the quantized in-phase and quadrature sample value representations to an OFDM transmission frame.

In some embodiments, the statistics mapper may comprise a statistics look-up table implementing the mapping function and be adapted to address the statistics look-up table with the average absolute sample value.

According to some embodiments, the time domain complex valued OFDM data block may be comprised in a first data stream having a variable first data rate and the OFDM transmission frame may be comprised in a second data stream having a fixed second data rate, and the compressor may further comprise a selector adapted to select the number of quantization thresholds based on the first and second data rates.

The compressor may further comprise a quantization threshold scaler adapted to scale the number of quantization thresholds by the standard deviation value. The quantization threshold scaler may, in some embodiments, comprise a quantization look-up-table implementing the quantization thresholds for each selected number of quantization thresholds.

A fourth aspect is a de-compressor comprising a receiver, a standard deviation extractor, a sample extractor, a re-constructer, and a combiner.

The receiver is adapted to receive an OFDM transmission frame comprising a standard deviation value and a plurality of quantized in-phase and quadrature sample value representations each comprising a second number of bits, the standard deviation extractor is adapted to extract the standard deviation value, and the sample extractor is adapted to extract the quantized in-phase and quadrature sample value representations.

The re-constructer is adapted to, for each of the quantized in-phase and quadrature sample value representations, map the quantized in-phase or quadrature value representation to a reconstruction level scaled by the standard deviation value to produce a reconstructed in-phase or quadrature sample value represented by a third number of bits, wherein the second number of bits are fewer than the third number of bits, and the combiner is adapted to combine the plurality of reconstructed in-phase and quadrature sample values to a reconstructed time domain complex valued OFDM data block.

A fifth aspect is a network node comprising one or more compressors according to the third aspect and one or more de-compressors according to the fourth aspect. The network node may, for example, be a radio base station.

The one or more compressors may comprise a down-link compressor comprised in a baseband unit of the network node and the one or more de-compressors may comprise a down-link de-compressor comprised in a radio unit of the network node. Alternatively or additionally, the one or more compressors may comprise an up-link compressor comprised in a radio unit of the network node and the one or more de-compressors may comprise an up-link de-compressor comprised in a baseband unit of the network node.

In some embodiments, the third and fourth aspects may additionally have features identical with or corresponding to any of the various features as explained above for the first and second aspects respectively. Furthermore, the second and fourth aspects may additionally have features identical with or corresponding to any of the various features as explained above for the first aspect.

An advantage of some embodiments is that the amount of overhead signaling may be reduced since only one characterizing parameter (the standard deviation value) is transmitted per data block or per frame.

Another advantage of some embodiments is that the mapping from average absolute sample value to standard deviation value is simplified by including a minimum amount of terms in the sum of the mapping function. This is particularly beneficial when the mapping is implemented through calculation.

A further advantage of some embodiments is that the mapping function is more accurate than mapping functions according to the prior art (e.g. "Block Adaptive Quantization of Magellan SAR Data" by R. Kwok, W. Johnson, IEEE transactions on Geoscience and Remote Sensing, vol. 27, no. 4, July 1989, pp. 375-383).

Yet a further advantage of some embodiments is that the transfer data rate may be controlled. For example, the transfer data rate may be kept constant regardless of the input data rate.

BRIEF DESCRIPTION OF THE DRAWINGS

Further objects, features and advantages will appear from the following detailed description of embodiments, with reference being made to the accompanying drawings, in which:

FIG. 1 is a flowchart illustrating example method steps according to some embodiments;

FIG. 2 is a flowchart illustrating example method steps according to some embodiments;

DETAILED DESCRIPTION

Figure 3:
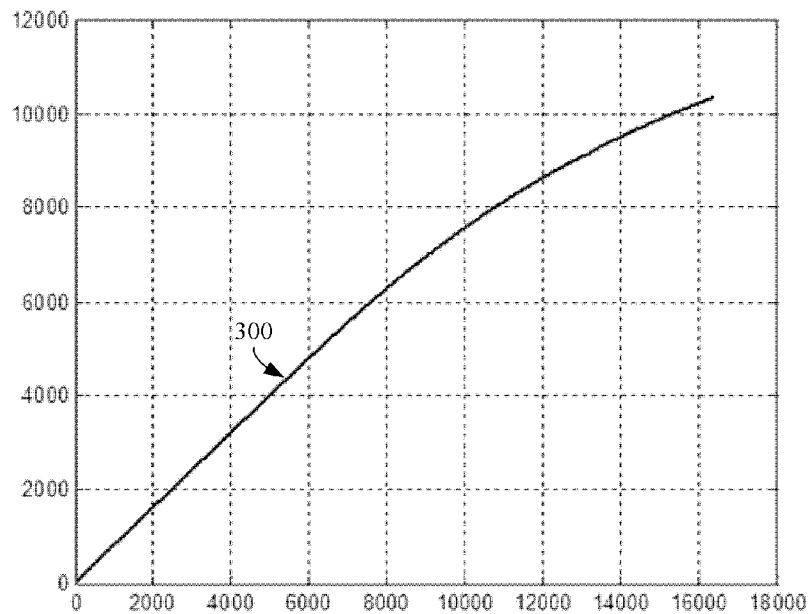
FIG. 3 is a plot illustrating an example mapping function according to some embodiments.

In the following, embodiments will be described that provide data compression and de-compression of complex valued OFDM signals suitable for use with a common public radio interface (CPRI) of a radio base station compliant with the UMTS LTE/LTE-A. The compression and de-compression of complex valued OFDM signals may, however, also be used in other applications.

A time domain complex valued digitized discrete OFDM signal defined over a time interval $t\in[0, NT]$ with N data symbols transmitted via N distinct sub-channels may be represented by $$s_N(t) = \frac{1}{\sqrt{N}} \sum_{i=0}^{N-1} A_i e^{j\omega_i t}, \omega_i = \frac{2\pi i}{NT},$$

where $A_i$ represent a complex valued baseband modulated symbol. If this OFDM signal is sampled at $t=nT$, the discrete complex valued OFDM samples may be denoted as $$s_n = \frac{1}{\sqrt{N}} \sum_{i=0}^{N-1} A_i e^{j\frac{2\pi i n}{N}},$$

$n=0, 1, \ldots, N-1$, where $s_n$ is a sum of independent and identically distributed (i.i.d.) random variables. According to the central limit theorem, $s_n$ converges to a zero-mean stationary Gaussian random process when the number of subcarriers goes to infinity, and may be approximated as such also for a limited number of sub-carriers which approximation may be applied in some of the following embodiments.

When a compressed OFDM signal is transferred via CPRI according to some embodiments, data transportation is enabled at a lower data rate than with an un-compressed signal. This in turn enables improved capacity of CPRI (e.g. between BBU and RRU), decreased hardware and/or software complexity, and decreased cost for fiber optic modules and/or high speed SerDes.

The compression and de-compression of complex valued OFDM signals is based on quantization and reconstruction of complex valued data samples, i.e. data samples with an in-phase part and a quadrature part, also denoted I/Q data.

Some embodiments use a non-uniform multi-rate block adaptive quantization with fixed length encoding. A compression ratio of up to [uncompressed bit length]:[compressed bit length]=2:1 is made possible, while the error vector magnitude (EVM) loss may be constrained to an acceptable level and the signal-to-noise ratio (SNR) loss is minimized in terms of minimum mean square error (MMSE) based on statistics of the complex valued OFDM signals. For example, if the bit length for uncompressed I/Q sample is 15 bits (for 90 dB dynamic range, fixed signed format) and if the compressor outputs 7 bits per I/Q sample, then 46.67% compression ratio is achieved. If 3% is used for compression parameters overhead, the compression ratio is 50%.

FIG. 1 illustrates an example compression method 100 according to some embodiments. A time domain complex valued OFDM data block of L consecutive complex valued samples is received in step 110, wherein the block size L is adjustable. Each of the L complex valued samples comprises an in-phase sample value and a quadrature sample value, each represented by M bits (herein it is assumed that the M bits includes a sign bit). The receiving step 110 may involve buffering of data in some applications.

The absolute value of each in-phase and quadrature sample value is determined in step 115 and an average absolute sample value is calculated in step 120. The average may, for example, be calculated over all in-phase and quadrature sample values of the data block. The calculation may, for example be implemented through accumulation (or integration) and scaling of absolute sample values, e.g. as $$\overline{|x|} = \frac{1}{2L} \sum_{l=0}^{L-1} (|I_l| + |Q_l|),$$

where $[x_0, \ldots, x_{L-1}] = [(I_0, Q_0), \ldots, (I_{L-1}, Q_{L-1})]$ is the time domain complex valued OFDM data block and $\overline{|x|}$ is the average absolute sample value.

In step 125, the average absolute sample value is mapped to a standard deviation value representing an approximation of the standard deviation of in-phase and quadrature sample values. The mapping may be based on a mapping function which expresses the average absolute sample value as a first function minus a second function, wherein the first function is a function of the first number of bits and the second function is a sum of $2^{(M-1)}-1$ terms, each term comprising a function of the standard deviation. The mapping function may, for example, be $$\overline{|x|} = (2^{(M-1)} - 0.5) - \sum_{m=0}^{(2^{(M-1)}-2)} \text{erf}\left(\frac{m+1}{\sigma\sqrt{2}}\right),$$

where σ denotes the standard deviation value, it is assumed that $[I_0, \ldots, I_{L-1}]$ and $[Q_0, \ldots, Q_{L-1}]$ are independent and identically distributed (i.i.d.) Gaussian variables with mean value 0 and standard deviation σ (i.e. N(0,σ²)), and the error function is defined as $$\text{erf}(z) = \frac{2}{\sqrt{\pi}} \int_0^z e^{-t^2} dt.$$

The example mapping function above may be derived from simplification of $$|x| = 2 \sum_{m=0}^{(2^{(M-1)}-2)} (x_m + 0.5) \int_{x_m}^{x_{m+1}} p_X(x) dx + 2(x_{(2^{(M-1)})} + 0.5) \int_{x_{(2^{(M-1)})}}^{\infty} p_X(x) dx,$$

where $p_x(x)$ is the Gaussian probability function and $x_m$ correspond to the different sample values represented by M bits.

FIG. 3 illustrates this example mapping function 300, where the standard deviation values are represented on the x-axis and the average absolute values are represented on the y-axis.

It should be noted that the summation is from 0 to $2^{M-1}-2$ as opposed to "Block Adaptive Quantization of Magellan SAR Data" by R. Kwok, W. Johnson, IEEE transactions on Geoscience and Remote Sensing, vol. 27, no. 4, July 1989, pp. 375-383, where the summation goes from 0 to $2^{M-1}-1$.

The mapping may, for example, be performed through calculation or through addressing of a look-up table implementing the mapping function. If the look-up table is implemented as a one-to-one mapping in a read only memory (ROM) the average absolute sample value may be used directly as the addressing value.

The applicable quantization thresholds are scaled with the standard deviation value in step 130, i.e. $\hat{Q}=\sigma Q=[\sigma q_0, \ldots, \sigma q_{2^K-2}]$, where $q_i$, $i=0, \ldots, 2^K-2$ represent the un-scaled quantization thresholds.

The quantization thresholds may be chosen such that the quantization error becomes as small as possible in an MMSE sense. For example, the Lloyd-Max algorithm as presented in "Least Squares Quantization in PCM" by S. Lloyd, IEEE transactions on Information Theory, vol. IT-28, no.2, March 1982, pp. 129-137 may be applied.

The number of quantization thresholds (and thus the number of bits K of the representation) may be variable and may be associated with various compression modes. The applicable compression mode may be selected in step 105 based on the relation between an incoming data rate and a desired compressed data rate. For example, the data rate of the incoming stream (in which the OFDM block under processing is comprised) may vary and it may be desired to control the output data rate (the rate of the stream to be transmitted over the CPRI such that it is kept at a constant value. The relation between the number (M) of bits per sample in the input data rate and the number of bits (K) per sample in the output data rate may define the applicable compression mode.

Each of the in-phase and quadrature sample values ($I_l$ and $Q_l$, l=0, ..., L-1) of the data block are then quantized using the scaled quantization thresholds in step 140:

$$\text{quantized}(I_l) = \begin{cases} w_0 & I_l < \sigma q_0 \\ w_k & \sigma q_k \le I_l < \sigma q_{k+1}; k=0, \ldots, 2^K-2, \\ w_{2^K-1} & \sigma q_{2^K-1} \le I_l \end{cases}$$

and equivalently for $Q_l$, where $[w_0, \ldots, w_{2^K-1}]$ are the representations of the quantized sample values each comprising K bits (where K is typically smaller than M).

It should be noted that scaling each of the in-phase and quadrature sample values by 1/σ and quantizing them using un-scaled quantization thresholds is equivalent to the operations in steps 130 and 140.

The quantization thresholds (and/or the scaled quantization thresholds) may, for example, be memorized in a look-up table.

The standard deviation value and the quantized sample value representations are mapped to an OFDM transmission frame in steps 135 and 145 respectively. It should be noted that steps 135 and 145 may be performed in parallel or separately as illustrated in FIG. 1 (step 135 may be performed before, during or after execution of step 140). Typically, the standard deviation value may be mapped to a control and management (C&M) information field of the transmission frame and the quantized sample value representations may be mapped to a respective antenna channel (AxC) field of the transmission frame, and the transmission frame may be transported via the CPRI layer 1 data link.

Several data blocks may be processed in a similar manner to fill up the OFDM transmission frame as illustrated by step 150. Each data blocks may be associated with a separate standard deviation value or all data blocks of a transmission frame may share standard deviation value.

Finally, the OFDM transmission frame is transmitted over a data link (e.g. CPRI) in step 155.

FIG. 2 illustrates an example de-compression method 200 according to some embodiments. An OFDM transmission frame comprising a standard deviation value and a plurality of quantized in-phase and quadrature sample value representations (each comprising K bits) is received over a data link (e.g. CPRI) in step 205. For example, the transmission frame received in step 205 may correspond to the OFDM transmission frame created during execution of the method 100 of FIG. 1.

An applicable compression mode (compare with step 105 of FIG. 1) may be extracted from the OFDM transmission frame in step 210 for application in the following steps.

The standard deviation value is extracted (e.g. by a de-mapping operation from, for example, a C&M information field) from the OFDM transmission frame in step 215 and the quantized sample value representations corresponding to a data block are extracted (e.g. by a de-mapping operation from, for example, an AxC container field) from the OFDM transmission frame in step 225. As mentioned before, the blocks of the OFDM transmission frame may share a single standard deviation value or each data block may correspond to its own standard deviation value. In the latter case, step 215 is performed for each data block (e.g. for each start indication of a compressed data block) as indicated in FIG. 2, while step 215 may be performed once per OFDM transmission frame in the former case.

The standard deviation value is used in a reconstruction operation. Each of the quantized in-phase and quadrature sample value representations (comprising K bits) is mapped to a reconstruction level scaled by the standard deviation to produce a reconstructed sample value comprising P bits (where K is typically smaller than P, and K may or may not equal M).

Which set of reconstruction levels to use may be determined by the extracted compression mode of step 210.

In one approach and as illustrated in FIG. 1, a set of applicable reconstruction levels are first scaled with the standard deviation value in step 220 and then the reconstructed samples are achieved by mapping of quantized sample representations to the scaled reconstruction levels in step 230.

Scaling of the applicable quantization thresholds in step 220 may, for example, be expressed by $\hat{R}=\sigma R=[\sigma r_0, \ldots, \sigma r_{2^K-1}]$, where $r_i$, $i=0, \ldots, 2^K-1$ represent the un-scaled reconstruction levels, and mapping of quantized sample representations to scaled reconstruction levels in step 230 may comprise a one-to-one mapping between the representations of the quantized sample values $[w_0, \ldots, w_{2^K-1}]$ and the scaled reconstruction levels $[\sigma r_0, \ldots, \sigma r_{2^K-1}]$.

The reconstruction levels (and/or the scaled reconstruction levels) may, for example, be memorized in a look-up table. If the look-up table is implemented as a one-to-one mapping in a read only memory (ROM) the quantized sample value representations may be used directly as the addressing value.

Finally, the appropriate reconstructed in-phase and quadrature sample values are combined to form a reconstructed time domain complex valued OFDM data block of L consecutive complex valued samples in step 235.

If there are more data blocks in the OFDM transmission frame (No path out from step 240), the process returns to step 215 to process a new data block of the OFDM transmission frame (or to step 225 if the data blocks of the OFDM transmission frame share a single standard deviation value). If there are no more data blocks in the OFDM transmission frame (Yes path out from step 240), the process returns to step 205 to process a new OFDM transmission frame.

It should be noted that steps 215 and 225 may be performed in parallel or separately as illustrated in FIG. 2 (step 225 may be performed before, during or after execution of step 220).

Figure 4:
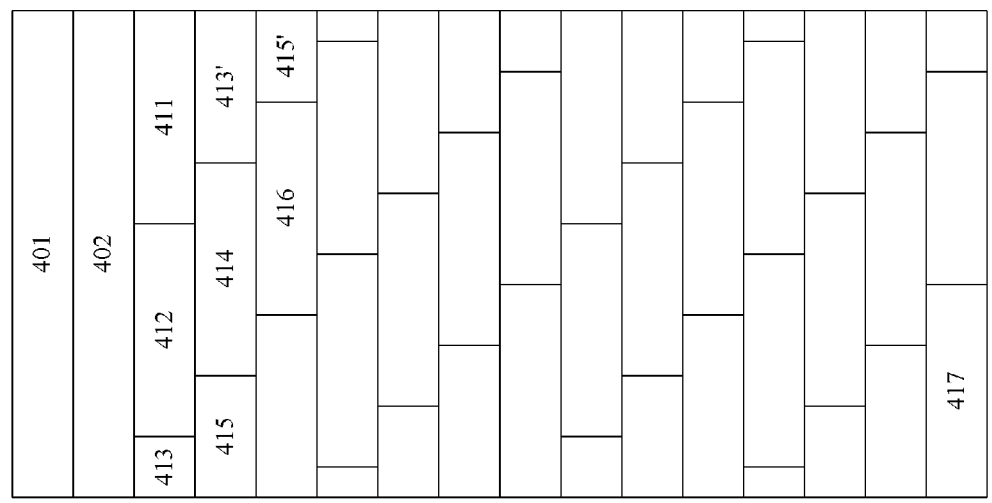
FIG. 4 is a schematic drawing illustrating an example OFDM transmission frame according to some embodiments.

FIG. 4 illustrate an example OFDM transmission frame (e.g. a CPRI basic frame) which may, for example, correspond to any of the OFDM transmission frames as described in connection to FIGS. 1 and 2. Time domain complex valued OFDM data blocks have been compressed (e.g. in accordance with method 100 of FIG. 1) and mapped block by block to the OFDM transmission frame in a non-overlapping manner. Each non-compressed data block comprises L consecutive complex valued samples, where L is adjustable.

The example of FIG. 4 may illustrate the result of a compression from a 15 bit representation to a 7 bit representation (both representations excluding the sign bit) for LTE downlink and/or uplink I/Q mapping into a single basic frame for line rate 2457.6 Mbps. According to this example, there are 14 bits per AxC container (AxC0 (411), AxC1 (412), AxC2 (413+413'), AxC3 (414), AxC4 (415+415'), AxC5 (416), . . . ,AxC31 (417)) and 14*32=448 bits per frame are occupied by compressed I/Q data. The bits in each AxC container may, for example, be organized such that the bits representing the quantized in-phase sample (organized from most significant bit to least significant bit or vice versa) precede the bits representing the quantized quadrature sample (organized from most significant bit to least significant bit or vice versa), or vice versa. Two control words, control word 1 (401) and control word 2 (402), are pre-pended in the OFDM transmission frame and compression overhead (statistics such as standard deviation value(s), indication flags such as compression mode flag(s), etc.) may, for example be mapped to control word 2 (402).

Figure 5:
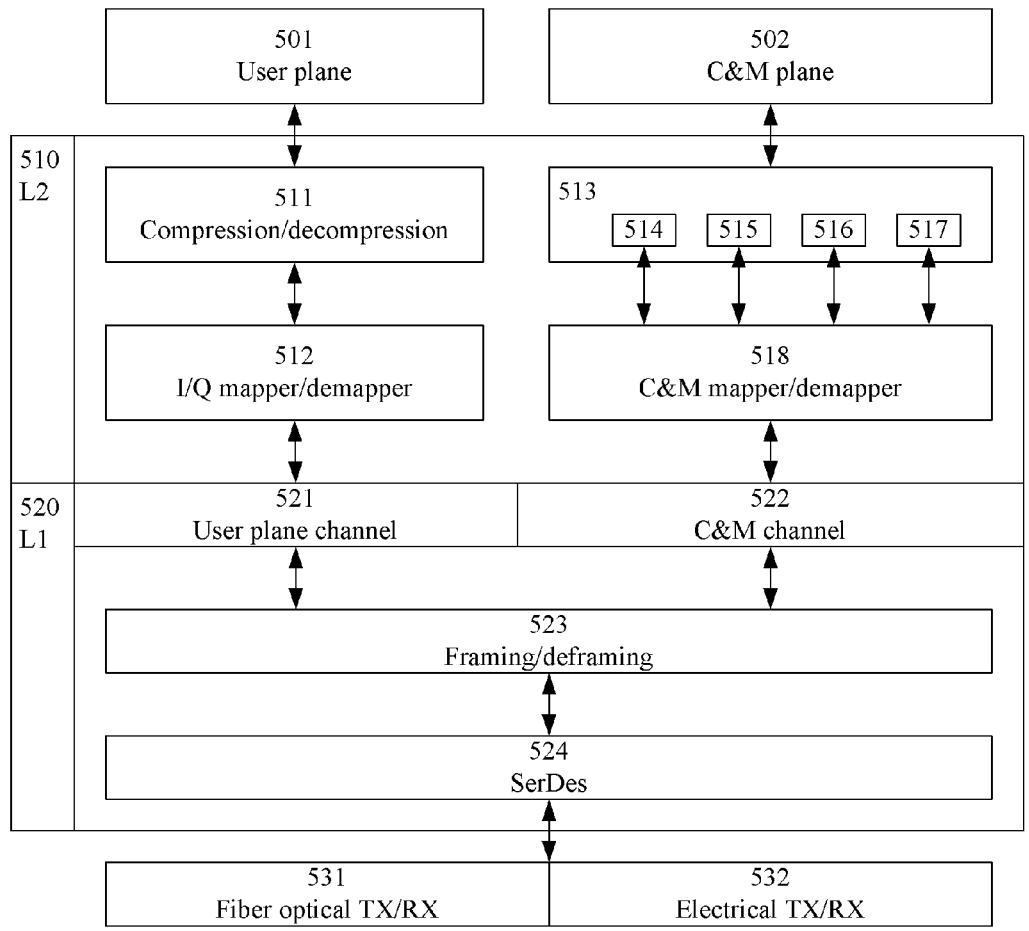
FIG. 5 is a schematic drawing illustrating functions of an example CPRI protocol according to some embodiments.

FIG. 5 illustrate incorporation of some embodiments in an example CPRI protocol. The example CPRI protocol comprises a user plane 501 and a control and management (C&M) plane 502 and FIG. 5 illustrates the operations related to layer 2 (L2 510), layer 1 (L1 520) and the physical layer.

In layer 2, the user plane comprises compression and/or de-compression 511 (for example, according to any of the embodiments presented herein) and mapping/de-mapping 512 of compressed complex valued samples. Also in layer 2, the C&M plane comprises various control functions 513 and C&M mapping/de-mapping 518. The various control functions may, for example, comprise L1 in-band protocol 514, high-level data link control (HDLC) 515, Ethernet 516, and vendor specific bytes 517.

The interface between layer 1 and layer 2 for the mapped/de-mapped signal of the respective layer 2 mapper/de-mapper is a user plane channel 521 and a C&M channel 522, respectively. The layer 1 operations comprise framing/de-framing 523 and serializing/de-serializing (SerDes) 524, and the physical layer comprises transmission and reception (TX/RX) over optical fiber 531 and/or an electrical medium 532.

Most of these functions and operations are well known, e.g. from the CPRI specification) and are therefore not described in detail.

It may be noted that the compression/de-compression is constrained in the layer 2 user plane operations and therefore, such embodiments typically will not majorly influence the CPRI protocol except for the mapping/de-mapping of compression/de-compression overhead (e.g. statistics and mode flags) in the C&M channel. Some embodiments may also impose some modifications to the mapping/de-mapping in the user plane channel.

Figure 6:
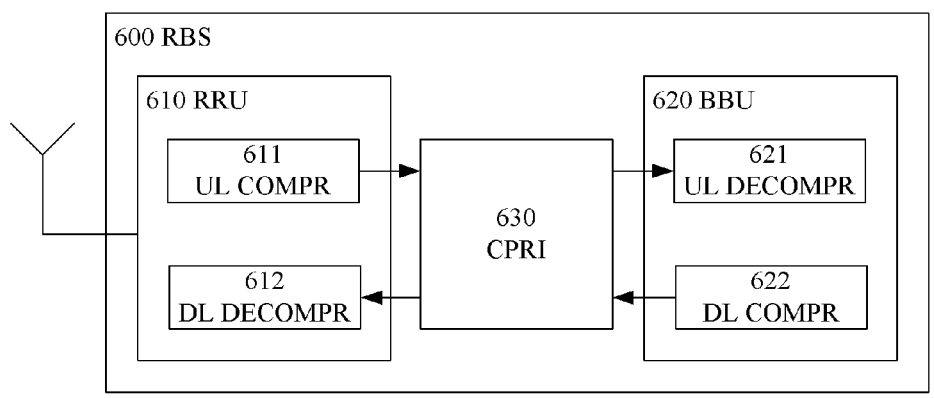
FIG. 6 is a block diagram illustrating an example network node according to some embodiments.

FIG. 6 illustrate an example network node (e.g. a radio base station, RBS) 600 comprising a remote radio unit (RRU) 610 and a baseband unit (BBU) 620 connected via an interface (CPRI, e.g. comprising optical fiber transmission) 630. As is illustrated in FIG. 6, a network node may comprise compression/de-compression pairs for both up-link (UL) and down-link (DL) data. Thus, the RRU 610 comprises an up-link data compressor (UL COMPR) 611 and a down-link data de-compressor (DL DECOMPR) 612 while the BBU 620 comprises an up-link data de-compressor (UL DECOMPR) 621 and a down-link data compressor (DL COMPR) 622. It should be noted that the embodiment of FIG. 6 is merely an example and that any topology of REC and RE may benefit from the approaches presented herein.

Figure 7:
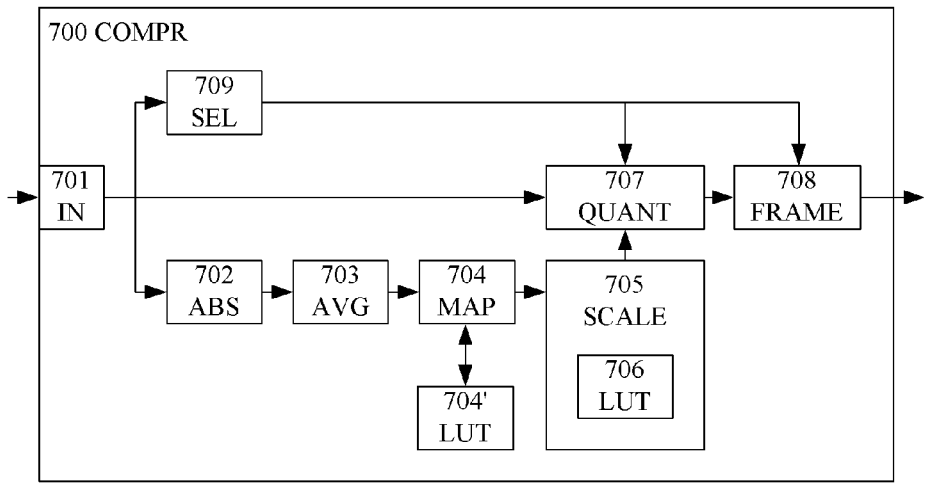
FIG. 7 is a block diagram illustrating an example compressor according to some embodiments.

FIG. 7 illustrates an example compressor (COMPR) 700 according to some embodiments. The compressor may, for example, be adapted to perform the method 100 described in connection to FIG. 1. The compressor 700 comprises an input port (IN) 701, an absolute value determiner (ABS) 702, an average calculator (AVG) 703, a statistics mapper (MAP) 704, a quantizer (QUANT) 707 and a framer (FRAME) 708.

The input port 701 is adapted to receive a time domain OFDM data block of L consecutive complex valued samples, wherein the block size L is adjustable. Each of the L complex valued samples comprises an in-phase sample value and a quadrature sample value, each represented by M bits. The input port 701 may, for example, be adapted to perform step 110 of FIG. 1.

The absolute value determiner 702 is adapted to determine an absolute value of each of the in-phase and quadrature sample values, and the average calculator 703 is adapted to calculate an average of the absolute sample values (typically over the block of L complex valued samples). The absolute value determiner 702 and the average calculator 703 may, for example, be adapted to perform steps 115 and 120, respectively, of FIG. 1.

The statistics mapper 704 is adapted to map the calculated average to a standard deviation value based on a mapping function. The statistics mapper 704 may also comprise a statistics look-up table (LUT) 704' implementing the mapping function. The look-up table 704' may be integral or external to the statistics mapper 704. In some embodiments, the statistics mapper 704 is adapted to address the look-up table 704' with the average absolute sample value. The statistics mapper may, for example, be adapted to perform step 125 of FIG. 1.

The quantizer 707 is adapted to quantize each of the in-phase and quadrature sample values using a number of quantization thresholds scaled by the standard deviation value. The quantizer 707 may, for example, be adapted to perform step 140 (and possibly also step 130) of FIG. 1.

The compressor may, in some embodiments, further comprise a quantization threshold scaler (SCALE) 705 adapted to scale the number of quantization thresholds by the standard deviation value. The quantization threshold scaler 705 may comprise a quantization look-up-table (LUT) 706 implementing the quantization thresholds for each selected number of quantization thresholds. The look-up table 706 may be integral or external to the scaler 705. In some embodiments, the scaler 705 may be comprised in the quantizer 707. The scaler may, for example, be adapted to perform step 130 of FIG. 1.

The framer 708 is adapted to map the standard deviation value and the quantized sample values to an OFDM transmission frame for transmission over a transmission medium. The framer 708 may, for example, be adapted to perform steps 135 and 145 of FIG. 1.

In some embodiments, the compressor 700 may also comprise a selector (SEL) 709 adapted to select a compression mode (e.g. a number of quantization thresholds to apply) based on a data rate at the input port 701 and a desired data rate at the output from the framer 708. The selector may, for example, be adapted to perform step 105 of FIG. 1.

Figure 8:
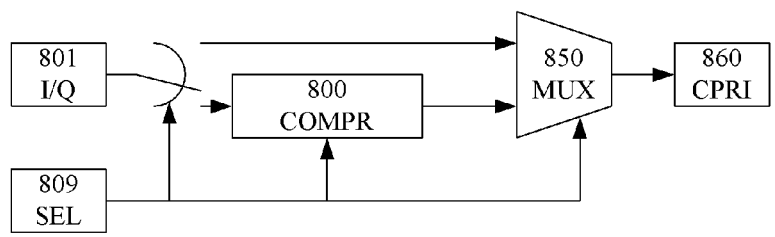
FIG. 8 is a block diagram illustrating an example arrangement with a compressor according to some embodiments.

FIG. 8 illustrates an arrangement for a compressor 800, wherein a compression mode selection is performed externally to the compressor 800. The arrangement comprises an I/Q data source (I/Q) 801, a compression mode selector (SEL) 809, a compressor (COMPR) 800, a multiplexer (MUX) 850 and a transmission medium (CPRI) 860. The mode selector 809 is adapted to control switching between un-compressed and compressed mode (via the switch of FIG. 8) and also between different compression rates, i.e. different number of quantization thresholds, (via a control signal input to the compressor 800). The mode selector 809 may, for example, select compression mode in a similar manner as the selector 709 of FIG. 7. In un-compressed mode, the I/Q data from the data source 801 is directly transferred via the multiplexer 850 to the transmission medium 860, where it is appropriately framed and transmitted.

In compressed mode, the I/Q data from the data source 801 is compressed in the compressor 800 (according to the compression mode control signal) and then the compressed samples and the compression overhead is transferred via the multiplexer 850 to the transmission medium 860, where it is appropriately framed and transmitted.

Figure 9:
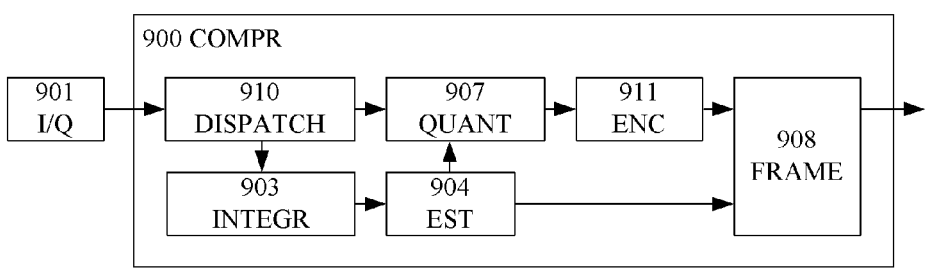
FIG. 9 is a block diagram illustrating an example compressor according to some embodiments.

FIG. 9 illustrates another example compressor (COMPR) 900 according to some embodiments. An I/Q data source (I/Q) 901 provides I/Q data to the compressor 900. The compressor comprises a dispatcher (DISPATCH) 910, an integrator (INTEGR) 903, an estimator (EST) 904, a quantizer (QUANT) 907, an encoder (ENC) 911 and a framer (FRAME) 908.

The I/Q data is dispatched in blocks of L complex samples in the dispatcher 910 and the average absolute value of the samples is calculated in the integrator 903. The operations of the integrator 903 may be similar or identical to those of 702 and 703 of FIG. 7 and 115 and 120 of FIG. 1.

The average absolute value is mapped to a corresponding standard deviation in the estimator 904. The operations of the estimator 904 may be similar or identical to those of 704 of FIG. 7 and 125 of FIG. 1.

The I/Q samples are then quantized based on the standard deviation in the quantizer 907. The operations of the quantizer 907 may be similar or identical to those of 707 of FIG. 7 and 140 of FIG. 1. The output of the quantizer 907 may undergo encoding in the encoder 911 and the quantized encoded samples together with the standard deviation are mapped to a transmission frame in the framer 908. The operations of the framer 908 may be similar or identical to those of 708 of FIG. 7 and 135 and 145 of FIG. 1.

Figure 10:
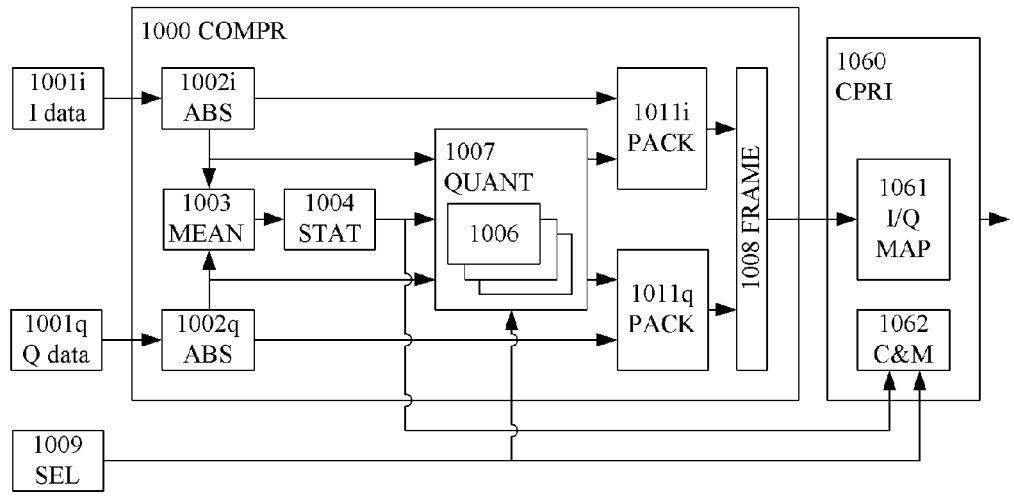
FIG. 10 is a block diagram illustrating an example arrangement with a compressor according to some embodiments.

FIG. 10 illustrates yet an example compressor (COMPR) 1000 according to some embodiments. An I/Q data source (I data and Q data) 1001$i$, 1001$q$ provides I/Q data to the compressor 1000. The compressor comprises two absolute value determiners (ABS) 1002$i$, 1002$q$, a mean value calculator (MEAN) 1003, a statistics mapper (STAT) 1004, a quantizer (QUANT) 1007 comprising a number of code books 1006 for different compression modes, two bit packers (PACK) 1011$i$, 1011$q$ and a framer (FRAME) 1008.

The absolute value of the respective I and Q samples are calculated in respective absolute value determiners 1002$i$ and 1002$q$ and forwarded to the mean value calculator 1003 which calculates the average absolute value of the I and Q samples. The sign bit of each sample is directly forwarded from the absolute value determiners to respective bit packers 1011$i$, 1011$q$. The operations of the absolute value determiners 1002$i$, 1002$q$ and the mean value calculator 1003 may be similar or identical to those of 702 and 703 of FIG. 7 and 115 and 120 of FIG. 1.

The average absolute value is mapped to a corresponding standard deviation in the statistics mapper 1004. The operations of the statistics mapper 1004 may be similar or identical to those of 704 of FIG. 7 and 125 of FIG. 1.

The I/Q samples (or actually just their absolute values for efficiency) are then quantized based on the standard deviation in the quantizer 1007. The arrangement of FIG. 10 also comprises a compression mode selector (SEL) 1009, which controls the quantizer 1007 by activating the appropriate code book 1006. The operations of the quantizer 1007 may be similar or identical to those of 707 of FIG. 7 and step 140 of FIG. 1, and the operations of the compression mode selector 1009 may be similar or identical to those of 709 of FIG. 7 and step 105 of FIG. 1.

The output of the quantizer 1007 is joined with the respective sign bit in the bit packers 1011$i$, 1011$q$ and the quantized signed samples are combined to complex valued quantized samples in the framer 1008.

A CPRI interface 1060 comprises a I/Q mapper 1061 which maps the complex valued quantized samples to a transmission frame and a C&M mapper 1062 which maps the standard deviation and a compression mode indicator to the transmission frame. The operations of the mappers 1061 and 1062 may be similar or identical to those of 708 of FIG. 7 and 135 and 145 of FIG. 1.

Figure 11:
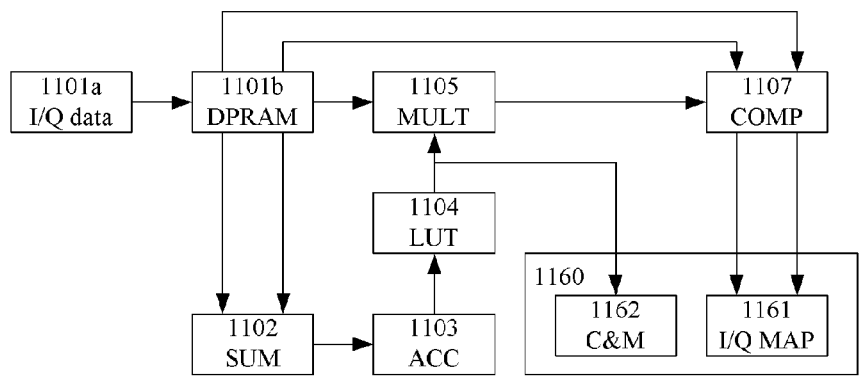
FIG. 11 is a block diagram illustrating an example arrangement with a compressor according to some embodiments.

FIG. 11 illustrates a logic diagram of a compressor according to some embodiments. An I/Q data source 1101$a$ feeds I/Q data samples to a I/Q data block DPRAM 1101*b* which outputs the I and Q sample (possibly without the sign bits) to a summation unit (SUM) 1102 which sums the magnitudes of the I and Q sample.

An accumulator (ACC) 1103 accumulates the magnitude sums for L complex samples (compare with steps 115 and 120 of FIG. 1) and the result is used to address a look-up table (LUT) 1104 to produce a corresponding standard deviation value (compare with step 125 of FIG. 1).

The standard deviation value output from the look-up table 1104 is used to scale a number of quantization thresholds in a multiplier (MULT) 1105 and the scaled quantization thresholds is used in a comparator (COMP) 1107 to quantize the I and Q samples output from the DPRAM 1101*b* (compare with steps 130 and 140 of FIG. 1).

The quantized I and Q samples are mapped to a transmission frame in an I/Q mapper (I/Q MAP) 1161 of a CPRI framer 1160 and the standard deviation value is mapped to the transmission frame in a C&M mapper (C&M) 1162 of the CPRI framer 1160 (compare with steps 135 and 145 of FIG. 1).

Various features of the embodiments presented in FIGS. 7-11 may be combined in other ways that those shown in the figures. For example, the selector 709 of the compressor 700 of FIG. 7 may be implemented externally to the compressor as illustrated in FIG. 8.

Figure 12:
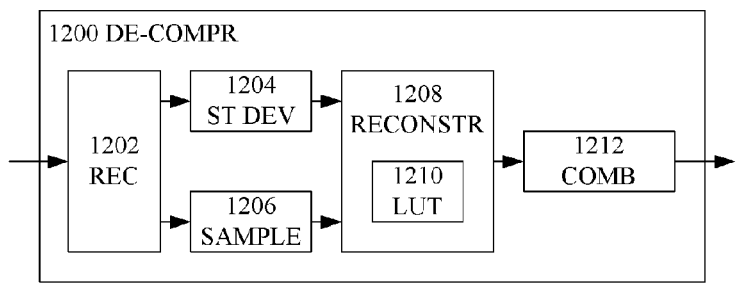
FIG. 12 is a block diagram illustrating an example de-compressor according to some embodiments.

FIG. 12 illustrates an example de-compressor (DE-COMPR) 1200 according to some embodiments. The de-compressor may, for example, be adapted to perform the method 200 described in connection to FIG. 2. The de-compressor 1200 comprises a receiver (REC) 1202, a standard deviation extractor (ST DEV) 1204, a sample extractor (SAMPLE) 1206, a re-constructer (RECONSTR) 1208 (possibly comprising in turn a look-up table (LUT) 1210), and a combiner (COMB) 1212.

The receiver 1202 is adapted to receive an OFDM transmission frame comprising a standard deviation value and a plurality of quantized in-phase and quadrature sample value representations. The receiver 1202 may, for example, be adapted to perform step 205 of FIG. 2.

The standard deviation extractor 1204 is adapted to extract the standard deviation value from the received frame and the sample extractor 1206 is adapted to extract the quantized in-phase and quadrature sample value representations. The blocks 1204 and 1206 may, for example, be adapted to perform steps 215 and 225 of FIG. 2 respectively.

The re-constructer 1208 is adapted to map each sample value representation to a reconstruction level scaled by the standard deviation value. The applicable reconstruction levels may be stored in the look-up table 1210. The re-constructer 1208 may, for example, be adapted to perform steps 220 and 230 of FIG. 2.

The combiner 1212 is adapted to combine the reconstructed sample values to a reconstructed time domain complex valued OFDM data block of L consecutive complex valued samples. The combiner 1212 may, for example, be adapted to perform step 235 of FIG. 2.

Figure 13:
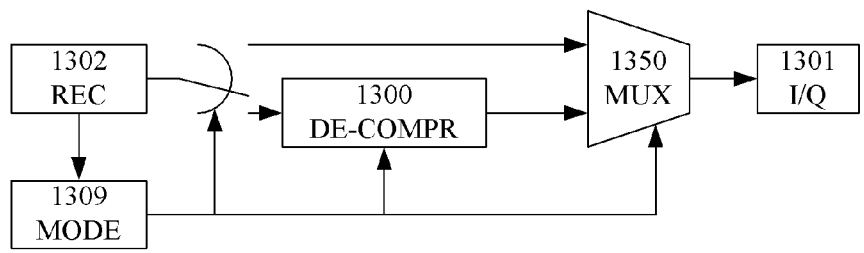
FIG. 13 is a block diagram illustrating an example arrangement with a de-compressor according to some embodiments.

FIG. 13 illustrates an arrangement for a de-compressor 1300, wherein a compression mode selection is included in the received transmission frame. The arrangement comprises transmission frame receiver (REC) 1302, a compression mode extractor (MODE) 1309, a de-compressor (DE-COMPR) 1300, a multiplexer (MUX) 1350 and an I/Q data sink (I/Q) 1301.

The compression mode is extracted from the received transmission frame by the mode extractor 1309. The mode extractor 1309 is adapted to control switching between un-compressed and compressed mode (via the switch of FIG. 13) and also between different compression rates, i.e. different number of quantization thresholds, (via a control signal input to the de-compressor 1300). The mode extractor 1309 may, for example, be adapted to perform step 210 of FIG. 2.

In un-compressed mode, the I/Q samples from the receiver 1302 is directly transferred via the multiplexer 1350 to the I/Q data sink 1301 for further processing.

In compressed mode, the I/Q samples from the receiver 1302 are de-compressed in the de-compressor 1300 (according to the compression mode control signal) and then the de-compressed samples are transferred via the multiplexer 1350 to the I/Q data sink 1301 for further processing.

Figure 14:
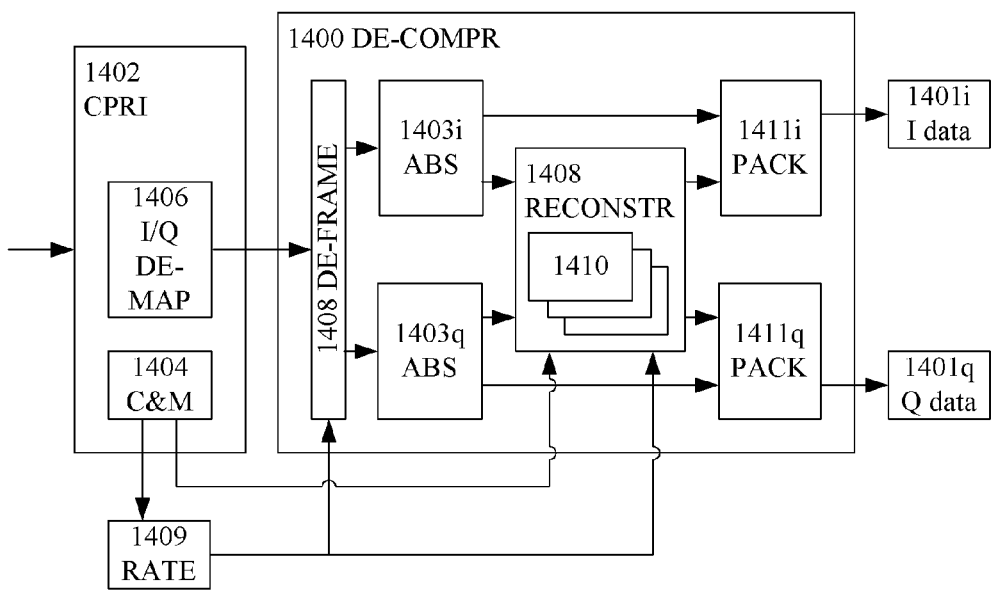
FIG. 14 is a block diagram illustrating an example arrangement with a de-compressor according to some embodiments.

FIG. 14 illustrates another example de-compressor (DE-COMPR) 1400 according to some embodiments. A CPRI interface 1402 comprises an I/Q de-mapper (I/Q DE-MAP) 1406 which extracts complex valued quantized samples from a transmission frame and a C&M de-mapper (C&M) 1404 which extracts the standard deviation and a compression mode indicator from the transmission frame. The operations of the de-mappers 1406 and 1404 may be similar or identical to those of 225 and 215 of FIG. 2.

A de-framer (DE-FRAME) 1408 of the de-compressor separates the quantized I and Q samples from each other and the absolute value of the respective quantized I and Q samples are calculated in respective absolute value determiners (ABS) 1403*i* and 1403*q*. The absolute values are forwarded to a re-constructer (RECONSTR) 1408. The sign bit of each quantized sample is directly forwarded from the absolute value determiners to respective bit packers 1411*i*, 1411*q*.

The quantized I/Q samples (or actually just their absolute values for efficiency) are then used to create corresponding reconstructed samples based on the standard deviation in the re-constructer 1408. The arrangement of FIG. 14 also comprises a compression rate controller (RATE) 1409, which controls the re-constructer 1408 by activating an appropriate one of a plurality of code books 1410. The operations of the re-constructer 1408 may be similar or identical to those of steps 220 and 230 of FIG. 2, and the operations of the compression rate controller 1409 may be similar or identical to those of step 210 of FIG. 2.

The outputs of the re-constructer 1408 are joined with the respective sign bit in the bit packers 1411*i*, 1411*q* and reconstructed signed samples are output to respective I and Q data sinks 1401*I* and 1401*q*.

Figure 15:
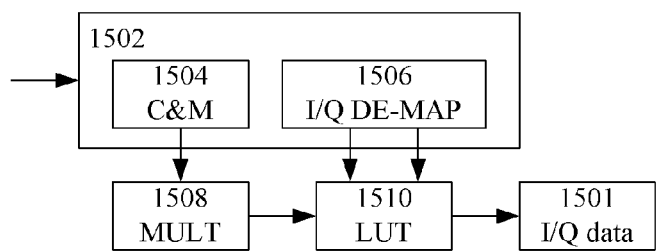
FIG. 15 is a block diagram illustrating an example arrangement with a de-compressor according to some embodiments.

FIG. 15 illustrates a logic diagram of a de-compressor according to some embodiments. A CPRI interface 1502 comprises an I/Q de-mapper (I/Q DE-MAP) 1506 which extracts complex valued quantized samples from a transmission frame and a C&M de-mapper (C&M) 1504 which extracts the standard deviation from the transmission frame.

The standard deviation value is used in a multiplier (MULT) 1508 to scale a number of reconstruction levels of a look-up table (LUT) 1510 and the quantized samples are used to address the look-up table 1510 to produce the corresponding scaled re-construction levels value which are used as output I/Q data 1501.

Various features of the embodiments presented in FIGS. 12-15 may be combined in other ways that those shown in the figures. For example, any of the de-compressors of FIGS. 12, 14 and 15 may be used in combination with the arrangement of FIG. 13.

An example of suitable quantization thresholds and corresponding reconstruction levels may be found in accordance to a Lloyd-Max code book. In the following table, a Lloyd-Max code book for K=7 and unit variance Gaussian source is given. It may be noted that the table is symmetric with regard to sign. Thus, an unsigned format codebook may be used for quantization and reconstructions in implementation as exemplified in FIGS. 10 and 14, and multiple codebooks with a different number of quantization thresholds may be used to implement a variable compression ratio.

| Quantization threshold (q) | Reconstruction level (r) | Bit representation (w) |
|---|---|---|
| −3.9619 | −4.1893 | 1000000 |
| −3.5908 | −3.7345 | 1000001 |
| −3.3393 | −3.4470 | 1000010 |
| −3.1442 | −3.2315 | 1000011 |
| −2.9827 | −3.0568 | 1000100 |
| −2.8439 | −2.9086 | 1000101 |
| −2.7213 | −2.7791 | 1000110 |
| −2.6111 | −2.6635 | 1000111 |
| −2.5105 | −2.5587 | 1001000 |
| −2.4179 | −2.4624 | 1001001 |
| −2.3316 | −2.3733 | 1001010 |
| −2.2508 | −2.2900 | 1001011 |
| −2.1747 | −2.2117 | 1001100 |
| −2.1025 | −2.1377 | 1001101 |
| −2.0338 | −2.0674 | 1001110 |
| −1.9682 | −2.0003 | 1001111 |
| −1.9053 | −1.9361 | 1010000 |
| −1.8448 | −1.8745 | 1010001 |
| −1.7865 | −1.8151 | 1010010 |
| −1.7301 | −1.7579 | 1010011 |
| −1.6756 | −1.7024 | 1010100 |
| −1.6226 | −1.6487 | 1010101 |
| −1.5711 | −1.5965 | 1010110 |
| −1.5210 | −1.5457 | 1010111 |
| −1.4721 | −1.4962 | 1011000 |
| −1.4244 | −1.4479 | 1011001 |
| −1.3777 | −1.4008 | 1011010 |
| −1.3320 | −1.3546 | 1011011 |
| −1.2872 | −1.3093 | 1011100 |
| −1.2432 | −1.2650 | 1011101 |
| −1.2001 | −1.2214 | 1011110 |
| −1.1576 | −1.1787 | 1011111 |
| −1.1159 | −1.1366 | 1100000 |
| −1.0748 | −1.0952 | 1100001 |
| −1.0343 | −1.0544 | 1100010 |
| −0.9943 | −1.0141 | 1100011 |
| −0.9549 | −0.9745 | 1100100 |
| −0.9159 | −0.9353 | 1100101 |
| −0.8774 | −0.8966 | 1100110 |
| −0.8394 | −0.8583 | 1100111 |
| −0.8017 | −0.8205 | 1101000 |
| −0.7645 | −0.7830 | 1101001 |
| −0.7275 | −0.7459 | 1101010 |
| −0.6909 | −0.7091 | 1101011 |
| −0.6546 | −0.6727 | 1101100 |
| −0.6186 | −0.6366 | 1101101 |
| −0.5829 | −0.6007 | 1101110 |
| −0.5474 | −0.5651 | 1101111 |
| −0.5121 | −0.5297 | 1110000 |
| −0.4771 | −0.4945 | 1110001 |
| −0.4422 | −0.4596 | 1110010 |
| −0.4075 | −0.4248 | 1110011 |
| −0.3730 | −0.3902 | 1110100 |
| −0.3386 | −0.3558 | 1110101 |
| −0.3044 | −0.3215 | 1110110 |
| −0.2703 | −0.2873 | 1110111 |
| −0.2363 | −0.2533 | 1111000 |
| −0.2024 | −0.2193 | 1111001 |
| −0.1685 | −0.1854 | 1111010 |
| −0.1347 | −0.1516 | 1111011 |
| −0.1010 | −0.1179 | 1111100 |
| −0.0673 | −0.0841 | 1111101 |
| −0.0337 | −0.0505 | 1111110 |
| 0 | −0.0168 | 1111111 |
| 0.0337 | 0.0168 | 0000000 |
| 0.0673 | 0.0505 | 0000001 |
| 0.1010 | 0.0841 | 0000010 |
| 0.1347 | 0.1179 | 0000011 |
| 0.1685 | 0.1516 | 0000100 |
| 0.2024 | 0.1854 | 0000101 |
| 0.2363 | 0.2193 | 0000110 |
| 0.2703 | 0.2533 | 0000111 |
| 0.3044 | 0.2873 | 0001000 |
| 0.3386 | 0.3215 | 0001001 |
| 0.3730 | 0.3558 | 0001010 |
| 0.4075 | 0.3902 | 0001011 |
| 0.4422 | 0.4248 | 0001100 |
| 0.4771 | 0.4596 | 0001101 |
| 0.5121 | 0.4945 | 0001110 |
| 0.5474 | 0.5297 | 0001111 |
| 0.5829 | 0.5651 | 0010000 |
| 0.6186 | 0.6007 | 0010001 |
| 0.6546 | 0.6366 | 0010010 |
| 0.6909 | 0.6727 | 0010011 |
| 0.7275 | 0.7091 | 0010100 |
| 0.7645 | 0.7459 | 0010101 |
| 0.8017 | 0.7830 | 0010110 |
| 0.8394 | 0.8205 | 0010111 |
| 0.8774 | 0.8583 | 0011000 |
| 0.9159 | 0.8966 | 0011001 |
| 0.9549 | 0.9353 | 0011010 |
| 0.9943 | 0.9745 | 0011011 |
| 1.0343 | 1.0141 | 0011100 |
| 1.0748 | 1.0544 | 0011101 |
| 1.1159 | 1.0952 | 0011110 |
| 1.1576 | 1.1366 | 0011111 |
| 1.2001 | 1.1787 | 0100000 |
| 1.2432 | 1.2214 | 0100001 |
| 1.2872 | 1.2650 | 0100010 |
| 1.3320 | 1.3093 | 0100011 |
| 1.3777 | 1.3546 | 0100100 |
| 1.4244 | 1.4008 | 0100101 |
| 1.4721 | 1.4479 | 0100110 |
| 1.5210 | 1.4962 | 0100111 |
| 1.5711 | 1.5457 | 0101000 |
| 1.6226 | 1.5965 | 0101001 |
| 1.6756 | 1.6487 | 0101010 |
| 1.7301 | 1.7024 | 0101011 |
| 1.7865 | 1.7579 | 0101100 |
| 1.8448 | 1.8151 | 0101101 |
| 1.9053 | 1.8745 | 0101110 |
| 1.9682 | 1.9361 | 0101111 |
| 2.0338 | 2.0003 | 0110000 |
| 2.1025 | 2.0674 | 0110001 |
| 2.1747 | 2.1377 | 0110010 |
| 2.2508 | 2.2117 | 0110011 |
| 2.3316 | 2.2900 | 0110100 |
| 2.4179 | 2.3733 | 0110101 |
| 2.5105 | 2.4624 | 0110110 |
| 2.6111 | 2.5587 | 0110111 |
| 2.7213 | 2.6635 | 0111000 |
| 2.8439 | 2.7791 | 0111001 |
| 2.9827 | 2.9086 | 0111010 |
| 3.1442 | 3.0568 | 0111011 |
| 3.3393 | 3.2315 | 0111100 |
| 3.5908 | 3.4470 | 0111101 |
| 3.9619 | 3.7345 | 0111110 |
| / | 4.1893 | 0111111 |

Figure 16:
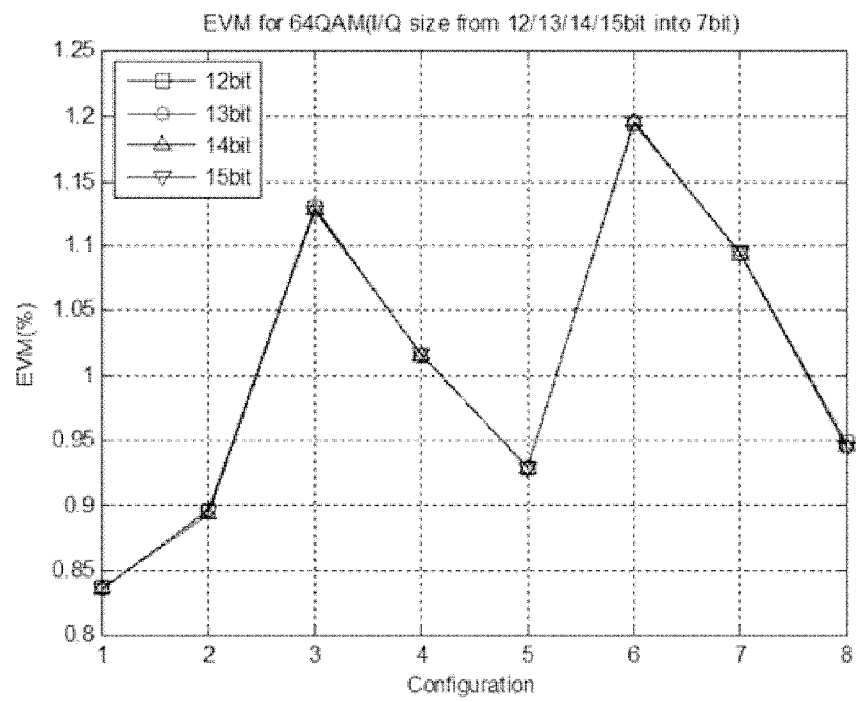
FIG. 16 is a plot of example results of simulations according to some embodiments.
Figure 17:
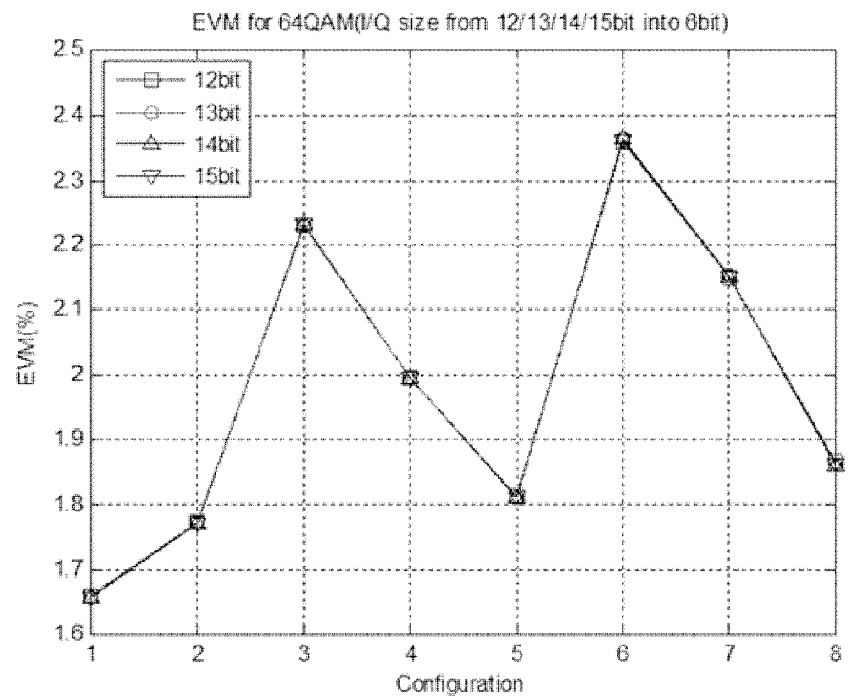
FIG. 17 is a plot of example results of simulations according to some embodiments.

FIGS. 16 and 17 illustrate results of numerical error vector magnitude (EVM) analysis simulations for a 64-QAM modulated signal where the averaged complex-valued time-domain OFDM signal power is defined as −15dBFs, and 1400 symbols (100 ms LTE radio frames) are used for averaging. The sample number per data block is set to 1024, and the data block length can be designed based on tradeoff between implementation latency and available computation resources.

FIG. 16 and the following table show induced EVM for 7 bit compression/decompression.

| Config. | Band-width (MHz) | Sample rate (Msps) | EVM (%) vs. I/Q bit size (signed fixed point) | | | |
|---|---|---|---|---|---|---|
| | | | 12 bit → 7 bit Cr = 58.33% | 13 bit → 7 bit Cr = 53.85% | 14 bit → 7 bit Cr = 50.00% | 15 bit → 7 bit Cr = 46.67% |
| 1 | 5 | 7.68 | 0.8379 | 0.8362 | 0.8377 | 0.8381 |
| 2 | 10 | 15.36 | 0.8967 | 0.8986 | 0.8947 | 0.8966 |
| 3 | 15 | 15.36 | 1.1297 | 1.1306 | 1.1285 | 1.1273 |
| 4 | 15 | 19.2 | 1.0166 | 1.0171 | 1.0166 | 1.0176 |
| 5 | 15 | 23.04 | 0.9292 | 0.9306 | 0.9301 | 0.9291 |
| 6 | 20 | 19.2 | 1.1946 | 1.1947 | 1.1966 | 1.1958 |
| 7 | 20 | 23.04 | 1.0950 | 1.0937 | 1.0947 | 1.0959 |
| 8 | 20 | 30.72 | 0.9487 | 0.9454 | 0.9461 | 0.9451 |

FIG. 17 and the following table show induced EVM for 6 bit compression/decompression.

| Config. | Band-width (MHz) | Sample rate (Msps) | EVM (%) vs. I/Q bit size (signed fixed point) | | | |
|---|---|---|---|---|---|---|
| | | | 12 bit → 6 bit C = 50.00% | 13 bit → 6 bit Cr = 46.15% | 14 bit → 6 bit Cr = 42.86% | 15 bit → 6 bit Cr = 40.00% |
| 1 | 5 | 7.68 | 1.6610 | 1.6580 | 1.6587 | 1.6591 |
| 2 | 10 | 15.36 | 1.7739 | 1.7743 | 1.7714 | 1.7711 |
| 3 | 15 | 15.36 | 2.2297 | 2.2305 | 2.2332 | 2.2324 |
| 4 | 15 | 19.2 | 1.9954 | 1.9963 | 1.9961 | 1.9954 |
| 5 | 15 | 23.04 | 1.8139 | 1.8130 | 1.8125 | 1.8134 |
| 6 | 20 | 19.2 | 2.3590 | 2.3635 | 2.3641 | 2.3629 |
| 7 | 20 | 23.04 | 2.1514 | 2.1544 | 2.1521 | 2.1509 |
| 8 | 20 | 30.72 | 1.8671 | 1.8607 | 1.8616 | 1.8637 |

For example, it can be seen that via a compression per I/Q data from 15 bits to 7 bits, a 2:1 bit length compression may be achieved at 0.95% EVM loss in E-TM3.1 (see the 3GPP specification document TS36.141, v.10.3.0 (2011-06)) 20M/30.72 Msps signal with 64-QAM modulated symbol.

Naturally, the above example simulation scenarios, covering 8 frequently used LTE/LTE-A bandwidth and sample rate configurations, should be viewed as examples only. The compression decompression embodiments are equally applicable to other bandwidth and sample rate configurations such as, for example, 3M/7.68 Msps, 3M/3.84 Msps, 1.4M/7.68 Msps, 1.4M/3.84 Msp in LTE/LTE-A air bandwidth of REC or RE HW.

By application of the described I/Q data compression of an OFDM signal, the bit length of the complex valued time domain OFDM data can be compressed to 50% of its original length. Thus, the capacity can be doubled given a constant CPRI line rate, which may translate to double bandwidth per carrier, carrier number per sector, MIMO streams, antenna number and cascading stages. Alternatively, the number of fiber optic links required between the BBU and RRU can be decreased and the cost of fiber optics and fiber optic transceivers can be reduced. Further, the number of SerDes required for a given bandwidth can be reduced (as well as their link rate), which may reduce board size, HW/SW complexity, and/or cost of FPGA implementations.

In embodiments using two look-up tables (for standard deviation and for quantization thresholds), a low latency may be achieved due to that addressing of a ROM is a low latency operation. The proposed algorithm is suitable for parallel implementation in e.g. CPU, DSP, FPGA, ASIC and/or SoC.

Since a constant data rate over the transmission medium is enabled, complexity due to timing and synchronization of non-fixed length coding may be avoided.

The described embodiments and their equivalents may be realized in software or hardware or a combination thereof. They may be performed by general-purpose circuits associated with or integral to a communication device, such as digital signal processors (DSP), central processing units (CPU), co-processor units, field-programmable gate arrays (FPGA) or other programmable hardware, or by specialized circuits such as for example application-specific integrated circuits (ASIC). All such forms are contemplated to be within the scope of this disclosure.

Embodiments may appear within an electronic apparatus (such as a wireless communication device) comprising circuitry/logic or performing methods according to any of the embodiments. The electronic apparatus may, for example, be a cellular network node or a radio base station.

According to some embodiments, a computer program product comprises a computer readable medium such as, for example, a diskette or a CD-ROM. The computer readable medium may have stored thereon a computer program comprising program instructions. The computer program may be loadable into a data-processing unit, which may, for example, be comprised in a mobile terminal. When loaded into the data-processing unit, the computer program may be stored in a memory associated with or integral to the data-processing unit. According to some embodiments, the computer program may, when loaded into and run by the data-processing unit, cause the data-processing unit to execute method steps according to, for example, the methods shown in any of the FIGS. 1 and 2.

Reference has been made herein to various embodiments. However, a person skilled in the art would recognize numerous variations to the described embodiments that would still fall within the scope of the claims. For example, the method embodiments described herein describes example methods through method steps being performed in a certain order. However, it is recognized that these sequences of events may take place in another order without departing from the scope of the claims. Furthermore, some method steps may be performed in parallel even though they have been described as being performed in sequence.

In the same manner, it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims.

Hence, it should be understood that the details of the described embodiments are merely for illustrative purpose and by no means limiting. Instead, all variations that fall within the range of the claims are intended to be embraced therein.

The invention claimed is:

1. A compression method comprising:
receiving a time-domain complex-valued Orthogonal Frequency-Division Multiplex (OFDM) data block comprising a plurality of complex-valued data samples wherein each complex-valued data sample comprises an in-phase sample value and a quadrature sample value, each represented by a first number, M, of bits;
determining an absolute sample value of each of the in-phase sample value and the quadrature sample value for each of the complex-valued data samples;
calculating an average of the absolute sample values of the time domain complex-valued OFDM data block to produce an average absolute sample value;
mapping the average absolute sample value to a standard deviation value associated with the absolute sample values based on a mapping function which expresses the average absolute sample value as a first function minus a second function, wherein the first function is a function of the first number of bits and the second function is a sum of $2^{(M-1)}-1$ terms, each term comprising a function of the standard deviation;
for each of the complex-valued data samples, quantizing each of the in-phase sample value and the quadrature sample value using a number of quantization thresholds scaled by the standard deviation value to produce quantized in-phase and quadrature sample value representations, each comprising a second number of bits, wherein the second number of bits are fewer than the first number of bits; and
mapping the standard deviation value and the quantized in-phase and quadrature sample value representations to an OFDM transmission frame.

2. The method of claim 1, wherein the quantization thresholds are based on a minimum mean square error between the in-phase and quadrature sample values and the quantized in-phase and quadrature sample value representations, wherein the in-phase and quadrature sample values have a Gaussian distribution with the standard deviation value and a mean value of zero.

3. The method of claim 1, wherein the mapping function is $$\overline{|x|} = (2^{(M-1)} - 0.5) - \sum_{m=0}^{2^{(M-1)}-2} \mathrm{erf}\left(\frac{m+1}{\sigma\sqrt{2}}\right),$$

wherein $\sigma$ denotes the standard deviation value and $\overline{|x|}$ denotes the average absolute sample value.

4. The method of claim 1, wherein mapping the average absolute sample value to the standard deviation value comprises addressing a statistics look-up table with the average absolute sample value, the statistics look-up table implementing the mapping function.

5. The method of claim 1, wherein the time domain complex-valued OFDM data block is comprised in a first data stream having a variable first data rate and the OFDM transmission frame is comprised in a second data stream having a fixed second data rate, the method further comprising selecting the number of quantization thresholds based on the first and second data rates.

6. A de-compression method comprising:
receiving an OFDM transmission frame comprising a standard deviation value and a plurality of quantized in-phase and quadrature sample value representations each comprising a second number of bits;
extracting the standard deviation value;
extracting the quantized sample value representations;
for each of the quantized in-phase and quadrature sample value representations, mapping the quantized in-phase or quadrature sample value representation to a reconstruction level scaled by the standard deviation value to produce a reconstructed in-phase or quadrature sample value represented by a third number of bits, wherein the second number of bits are fewer than the third number of bits; and
combining the plurality of reconstructed in-phase and quadrature sample values to a reconstructed time domain complex-valued OFDM data block.

7. The method of claim 6, wherein receiving the OFDM transmission frame is preceded by a compression method that comprises:
receiving a time-domain complex-valued Orthogonal Frequency-Division Multiplex (OFDM) data block comprising a plurality of complex-valued data samples wherein each complex-valued data sample comprises an in-phase sample value and a quadrature sample value, each represented by a first number, M, of bits;
determining an absolute sample value of each of the in-phase sample value and the quadrature sample value for each of the complex-valued data samples;
calculating an average of the absolute sample values of the time domain complex-valued OFDM data block to produce an average absolute sample value;
mapping the average absolute sample value to a standard deviation value associated with the absolute sample values based on a mapping function which expresses the average absolute sample value as a first function minus a second function, wherein the first function is a function of the first number of bits and the second function is a sum of $2^{(M-1)}-1$ terms, each term comprising a function of the standard deviation;
for each of the complex-valued data samples, quantizing each of the in-phase sample value and the quadrature sample value using a number of quantization thresholds scaled by the standard deviation value to produce quantized in-phase and quadrature sample value representations, each comprising a second number of bits, wherein the second number of bits are fewer than the first number of bits; and
mapping the standard deviation value and the quantized in-phase and quadrature sample value representations to the OFDM transmission frame.

8. A compressor circuit comprising processing circuitry configured to:
receive a time domain complex-valued OFDM data block comprising a plurality of complex-valued data samples wherein each complex-valued data sample comprises an in-phase sample value and a quadrature sample value, each represented by a first number, M, of bits;

determine an absolute sample value of each of the in-phase sample value and the quadrature sample value for each of the complex-valued data samples;

calculate an average of the absolute sample values of the time domain complex-valued OFDM data block to produce an average absolute sample value;

map the average absolute sample value to a standard deviation value associated with the absolute sample values based on a mapping function which expresses the average absolute sample value as a first function minus a second function, wherein the first function is a function of the first number of bits and the second function is a sum of $2^{(M-1)}-1$ terms, each term comprising a function of the standard deviation value;

for each of the complex-valued data samples, quantize each of the in-phase sample value and the quadrature sample value using a number of quantization thresholds scaled by the standard deviation value to produce quantized in-phase and quadrature sample value representations, each comprising a second number of bits, wherein the second number of bits are fewer than the first number of bits; and map the standard deviation value and the quantized in-phase and quadrature sample value representations to an OFDM transmission frame.

9. The compressor of claim 8, wherein the processing circuitry is configured to address, with the average absolute sample value, a statistics look-up table implementing the mapping function.

10. The compressor of claim 8, wherein the time domain complex-valued OFDM data block is comprised in a first data stream having a variable first data rate and the OFDM transmission frame is comprised in a second data stream having a fixed second data rate, wherein the processing circuitry is configured to select the number of quantization thresholds based on the first and second data rates.

11. The compressor of claim 10, wherein the processing circuitry is configured to scale the number of quantization thresholds by the standard deviation value.

12. The compressor of claim 11, wherein the processing circuitry is configured to use a quantization look-up-table implementing the quantization thresholds for each selected number of quantization thresholds.

13. A de-compressor comprising processing circuitry configured to:

receive an OFDM transmission frame comprising a standard deviation value and a plurality of quantized in-phase and quadrature sample value representations each comprising a second number of bits;

extract the standard deviation value;

extract the quantized in-phase and quadrature sample value representations;

for each of the quantized in-phase and quadrature sample value representations, map the quantized in-phase or quadrature sample value representation to a reconstruction level scaled by the standard deviation value to produce a reconstructed in-phase or quadrature sample value represented by a third number of bits, wherein the second number of bits are fewer than the third number of bits; and combine the plurality of reconstructed in-phase and quadrature sample values to a reconstructed time domain complex-valued OFDM data block.

14. A network node comprising the de-compressor of claim 13 and further comprising a compressor that comprises compressor processing circuitry configured to:

receive a time domain complex-valued OFDM data block comprising a plurality of complex-valued data samples wherein each complex-valued data sample comprises an in-phase sample value and a quadrature sample value, each represented by a first number, M, of bits;

determine an absolute sample value of each of the in-phase sample value and the quadrature sample value for each of the complex-valued data samples;

calculate an average of the absolute sample values of the time domain complex-valued OFDM data block to produce an average absolute sample value;

map the average absolute sample value to a standard deviation value associated with the absolute sample values based on a mapping function which expresses the average absolute sample value as a first function minus a second function, wherein the first function is a function of the first number of bits and the second function is a sum of $2^{(M-1)}-1$ terms, each term comprising a function of the standard deviation value;

for each of the complex-valued data samples, quantize each of the in-phase sample value and the quadrature sample value using a number of quantization thresholds scaled by the standard deviation value to produce quantized in-phase and quadrature sample value representations, each comprising a second number of bits, wherein the second number of bits are fewer than the first number of bits; and map the standard deviation value and the quantized in-phase and quadrature sample value representations to the OFDM transmission frame.

15. The network node of claim 14, wherein the compressor is a down-link compressor comprised in a baseband unit of the network node and the de-compressor is a down-link de-compressor comprised in a radio unit of the network node.

16. The network node of claim 14, wherein the compressor is an up-link compressor comprised in a radio unit of the network node and the de-compressor is an up-link de-compressor comprised in a baseband unit of the network node.

17. The network node of claim 14, wherein the OFDM transmission frame is a backhaul communication transmission frame.

* * * * *